United States Patent
Mayr

(10) Patent No.: US 12,464,649 B2
(45) Date of Patent: Nov. 4, 2025

(54) COMPONENT CARRIER WITH INDUCTIVE ELEMENT INCLUDED IN LAYER BUILD-UP, AND MANUFACTURING METHOD

(71) Applicant: AT&S Austria Technologie & Systemtechnik Aktiengesellschaft, Leoben (AT)

(72) Inventor: Günther Mayr, Milpitas, CA (US)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 287 days.

(21) Appl. No.: 17/663,965

(22) Filed: May 18, 2022

(65) Prior Publication Data

US 2022/0377900 A1    Nov. 24, 2022

Related U.S. Application Data

(60) Provisional application No. 63/189,762, filed on May 18, 2021.

(51) Int. Cl.
*H05K 1/18* (2006.01)
*H01F 27/28* (2006.01)
(Continued)

(52) U.S. Cl.
CPC ......... *H05K 1/182* (2013.01); *H01F 27/2804* (2013.01); *H01F 27/323* (2013.01);
(Continued)

(58) Field of Classification Search
CPC .......... H05K 1/00; H05K 1/02; H05K 1/0373; H05K 1/115; H05K 1/165; H05K 1/182;
(Continued)

(56) References Cited

U.S. PATENT DOCUMENTS

| 6,296,955 B1 * | 10/2001 | Hossain | G11B 5/3133 360/122 |
| 6,996,892 B1 * | 2/2006 | Dening | H05K 1/165 336/200 |

(Continued)

FOREIGN PATENT DOCUMENTS

| CN | 204994060 U | 1/2016 |
| CN | 106170176 A | 11/2016 |

(Continued)

OTHER PUBLICATIONS

Batev, P.; Extended European Search Report in Application No. 21189070.2; pp. 1-9; Jan. 1, 2022; European Patent Office; 80298, Munich, Germany.

*Primary Examiner* — Douglas X Rodriguez
(74) *Attorney, Agent, or Firm* — Robert A. Blaha; Smith Tempel Blaha LLC

(57) ABSTRACT

A component carrier includes a stack with at least one electrically insulating layer structure, a structured electrically conductive layer assembled to the stack, where a part of the structured electrically conductive layer is configured as an inductive element, and a magnetic matrix embedded in the stack. The magnetic matrix at least partially surrounds the inductive element. Further, a manufacturing method is described.

21 Claims, 3 Drawing Sheets

(51) Int. Cl.
*H01F 27/32* (2006.01)
*H01F 41/04* (2006.01)
*H01F 41/12* (2006.01)
*H05K 1/11* (2006.01)
*H05K 3/10* (2006.01)

(52) U.S. Cl.
CPC ......... *H01F 41/041* (2013.01); *H01F 41/122* (2013.01); *H05K 1/115* (2013.01); *H05K 3/10* (2013.01); *H01F 2027/2809* (2013.01); *H05K 2201/08* (2013.01); *H05K 2201/1003* (2013.01)

(58) Field of Classification Search
CPC ................ H05K 3/10; H05K 2201/08; H05K 2201/1003; H01F 27/0013; H01F 27/24; H01F 27/26; H01F 27/40; H01F 27/292; H01F 27/327; H01F 27/323; H01F 27/2804; H01F 41/041; H01F 41/046; H01F 41/122; H01L 21/486; H01L 21/4853; H01L 21/4857; H01L 21/4867; H01L 21/76816; H01L 23/15; H01L 23/66; H01L 23/498; H01L 23/645; H01L 23/5226; H01L 23/5227; H01L 23/5383; H01L 23/49827; H01L 23/49822; H01L 23/49866; H01L 23/49838
USPC ........................ 361/761; 336/200, 221, 223; 360/119.04, 319, 125.5; 428/815.2, 900; 438/381
See application file for complete search history.

(56) References Cited

U.S. PATENT DOCUMENTS

| | | | | |
|---|---|---|---|---|
| 2002/0057176 | A1* | 5/2002 | Norstrom | H01F 41/041 336/200 |
| 2006/0088971 | A1* | 4/2006 | Crawford | H05K 1/0373 257/E21.022 |
| 2006/0152321 | A1* | 7/2006 | Jung | H01F 17/0006 336/200 |
| 2006/0170527 | A1* | 8/2006 | Braunisch | H01F 41/046 257/E23.07 |
| 2009/0207576 | A1 | 8/2009 | Gardner et al. | |
| 2010/0033879 | A1* | 2/2010 | Ota | G11B 5/312 |
| 2011/0157746 | A1* | 6/2011 | Hirata | G11B 5/1278 360/119.04 |
| 2013/0342301 | A1* | 12/2013 | Mano | H01F 41/041 336/200 |
| 2014/0240075 | A1* | 8/2014 | Yang | H01F 17/0013 427/116 |
| 2019/0198436 | A1* | 6/2019 | Vadlamani | H05K 1/00 |
| 2019/0355675 | A1* | 11/2019 | Lee | H01F 41/14 |
| 2020/0005994 | A1* | 1/2020 | Lee | H01F 41/046 |
| 2020/0066634 | A1* | 2/2020 | Do | H01L 21/76816 |
| 2020/0168536 | A1* | 5/2020 | Link | H01L 23/49827 |
| 2020/0211985 | A1 | 7/2020 | Pietambaram et al. | |
| 2021/0005550 | A1 | 1/2021 | Chavali et al. | |
| 2022/0093537 | A1* | 3/2022 | Radhakrishnan | H01F 27/323 |
| 2022/0285079 | A1* | 9/2022 | Pietambaram | H01F 17/0013 |
| 2022/0293327 | A1* | 9/2022 | Ganesan | H01F 27/26 |

FOREIGN PATENT DOCUMENTS

| | | |
|---|---|---|
| CN | 109496069 A | 3/2019 |
| CN | 109561580 A | 4/2019 |
| CN | 110996506 A | 4/2020 |
| JP | 2011054672 A | 3/2011 |

* cited by examiner

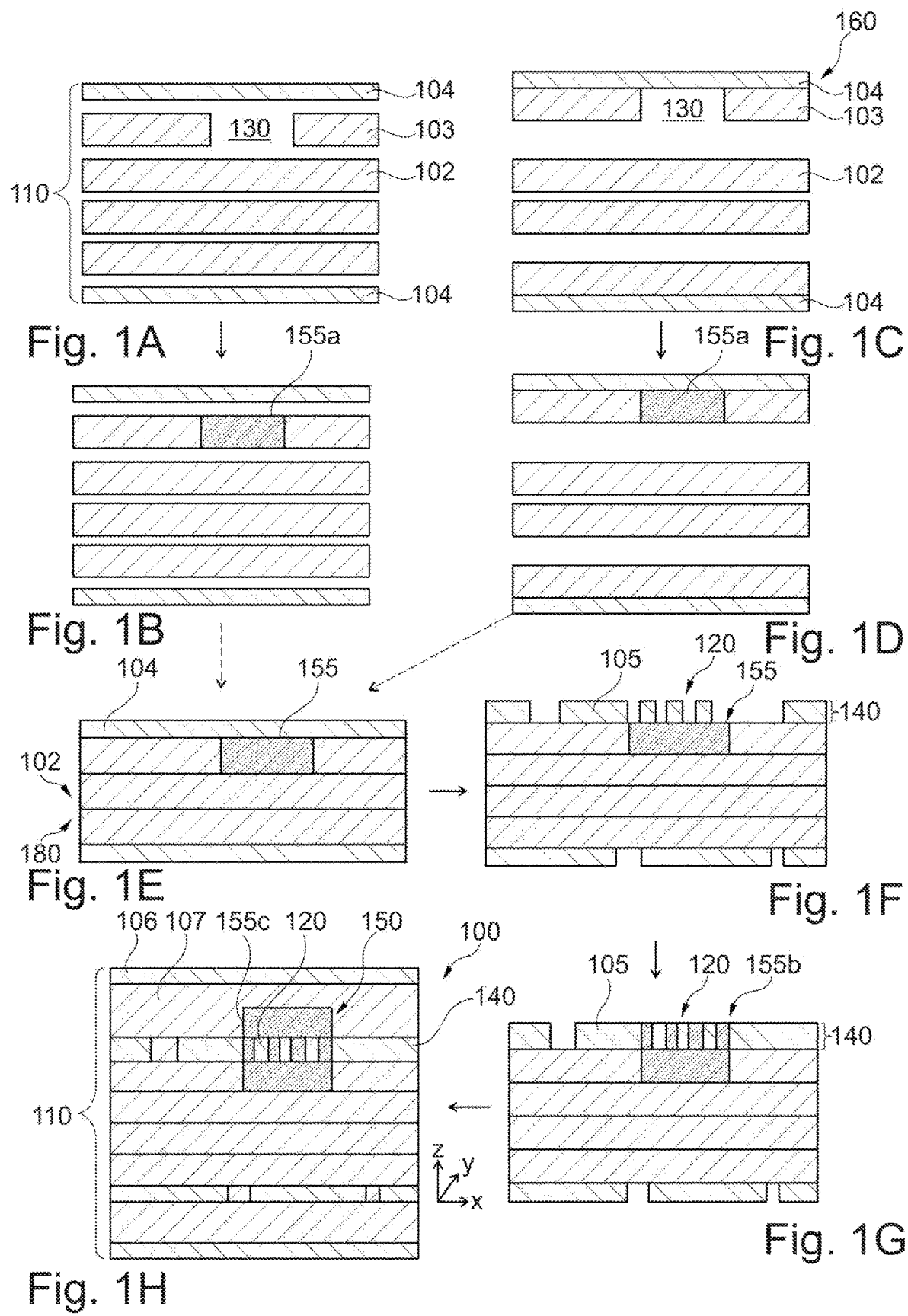

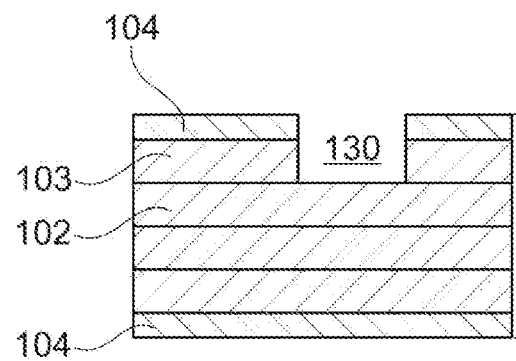
Fig. 2A
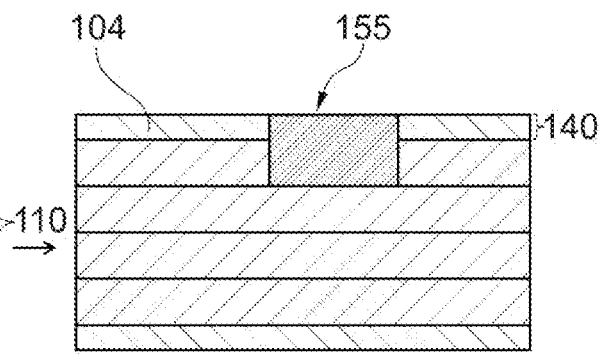
Fig. 2B
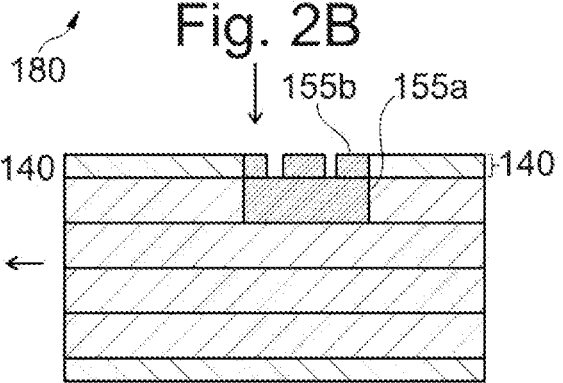
Fig. 2C
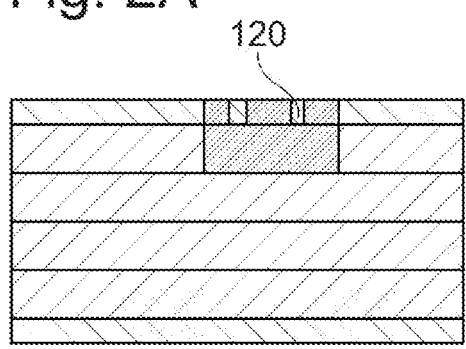
Fig. 2D
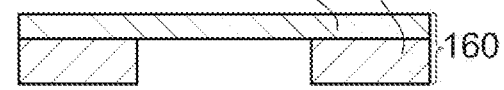
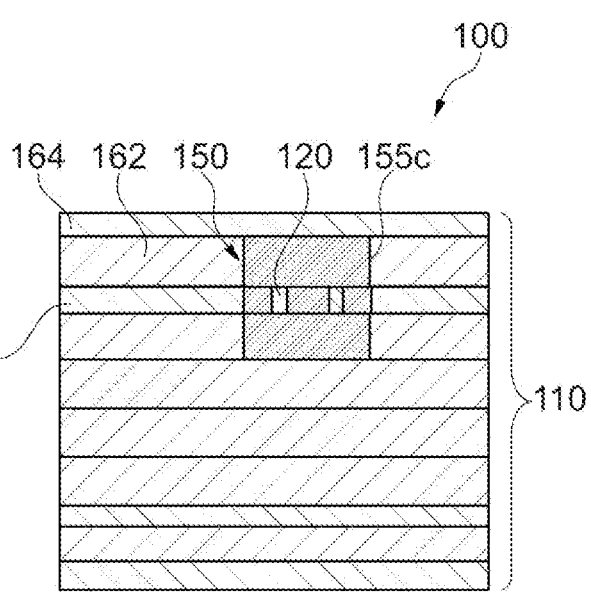
Fig. 2E
Fig. 2F ated herein

COMPONENT CARRIER WITH INDUCTIVE ELEMENT INCLUDED IN LAYER BUILD-UP, AND MANUFACTURING METHOD

CROSS-REFERENCE TO RELATED APPLICATIONS

This application claims the benefit of the filing date of Provisional Patent Application No. 63/189,762 filed May 18, 2021, the disclosure of which is hereby incorporated herein by reference.

TECHNICAL FIELD

Embodiments of the present invention relate to a component carrier with an inductive element that is at least partially surrounded by a magnetic matrix, and method of manufacturing a component carrier.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. Also, an efficient protection against electromagnetic interference (EMI) becomes an increasing issue. At the same time, component carriers shall be mechanically robust and electrically and magnetically reliable so as to be operable even under harsh conditions.

Moreover, an extended functionality of component carriers is demanded by users. For example, it is known to integrate magnetic material in a component carrier in order to provide/enhance an inductance for specific applications. However, the conventional approaches may suffer from drawbacks such as low inductance values, high production efforts/costs, and high ohmic resistances.

SUMMARY

There may be a need to provide an efficient and robust magnetically enhanced inductance for a component carrier (in particular during a component carrier build-up process).

A component carrier, a method of manufacturing the component carrier, and a use according to the independent claims are provided.

According to an aspect of the disclosure, a component carrier is described, comprising:
i) a (layer) stack comprising at least one (in particular only one) electrically insulating layer structure (in particular a plurality of electrically insulating layer structure(s) and/or electrically conductive layer structure(s)),
ii) (at least one) a structured electrically conductive layer (structure) (in particular a discontinuous layer) assembled (embedded or surface-mounted) to the stack, wherein a part of the structured electrically conductive layer (structure) is configured as an inductive element (for example comprising windings), and
iii) a magnetic matrix (for example a magnetic sheet, a magnetic film or magnetic paste) embedded in the stack, wherein the magnetic matrix (at least partially) (in particular fully) surrounds (encloses) the inductive element.

According to a further aspect of the disclosure, there is described a method of manufacturing a component carrier (for example as described above), the method comprising:
i) providing a stack comprising at least one electrically insulating layer structure,
ii) assembling (surface-mounting to or embedding in) an electrically conductive layer to the stack,
iii) structuring the electrically conductive layer (by removing and/or adding electrically conductive material), so that a part of the structured electrically conductive layer is configured as an inductive element, and
iv) assembling a magnetic matrix (in particular a first part and a second part) to the stack, so that the magnetic matrix at least partially surrounds the inductive element.

According to a further aspect of the disclosure, there is described a use (method of using) of a part of a structured electrically conductive layer (a discontinuous layer), which part is embedded in a magnetic matrix (that is embedded) within a component carrier layer stack, as an inductive element.

Overview of Embodiments

In the context of the present document, the term "magnetic matrix" may in particular refer to a base material (base substance) that comprises magnetic properties. The base material may be magnetic itself or magnetic particles may be distributed within a non-magnetic matrix material. The magnetic matrix may be configured for example rigid/solid (e.g., as magnetic sheets) or viscous (magnetic paste). The magnetic matrix may comprise electrically conductive material/particles and/or electrically insulating material/particles. Further, the magnetic matrix may be configured to have a relative magnetic permeability $\mu_r$ in a range from 2 to $10^6$, in particular 2 to 1000, more in particular 20 to 80. A plurality of different materials may be considered suitable to provide the base material and/or the embedded particles of the magnetic matrix, for example a ferromagnetic material (like iron), a ferrimagnetic material (like ferrite), a permanent magnetic material, a soft magnetic material, a metal oxide. In an example, a dielectric (resin) matrix with magnetic particles therein is used. In another example, magnetic sheets are applied that comprise magnetic particles embedded in a fiber-enforced resin (e.g., prepreg). In a further example, a magnetic paste is used that comprises magnetic particles embedded in a not fiber-enforced resin.

In the context of the present document, the term "inductive element" may in particular refer to an electrically conductive element that is configured to provide an inductance, i.e., to create a magnetic field, when an electric current is flowing though. In an example, the inductive element may comprise loops/windings, so that it functions (essentially) like an inductive coil. The inductance may be enhanced by the magnetic matrix that at least partially encloses the inductive element. The obtained inductance per area may be in the range 10 to 10000 nH/mm$^2$.

In the context of the present document, the term "structured electrically conductive layer (structure)" may in particular refer to an electrically conductive layer (structure) assembled to (in particular (at least partially) embedded in) a component carrier layer stack, wherein the electrically conductive layer (structure) has been structured (patterned) in a manner that a part of the electrically conductive layer (structure) may be used as the above-described inductive element. For example, an electrically conductive (copper) layer may be formed on component carrier material. Then, the layer is patterned (by removing material) so that a discontinuous layer (with isolated parts, but at the same vertical height in the layer stack) is obtained. At least a part of the patterned region is thereby structured (e.g., forming windings) so that the inductive element is obtained. In another example, the electrically conductive (copper) layer may be formed on component carrier material at least partially around embedded magnetic matrix material. In this example, a part of the magnetic matrix may be removed and the remaining gaps are filled with electrically conductive material (structuring by adding material). The added electrically conductive material may be located (essentially) that the same vertical height as the rest of the electrically conductive (copper) layer, and may thereby form part of a discontinuous structured electrically conductive layer (structure). In this document, the term "layer" may also include a film, a foil, or a sheet.

In the context of the present document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, a metal core substrate, an inorganic substrate and an IC (integrated circuit) substrate. A component carrier may also be a hybrid board combining different ones of the above-mentioned types of component carriers.

The inductive element embedded in the magnetic matrix may be considered as a magnetic element. Such a magnetic element may be essentially shaped as a plate, meaning that it comprises two directions of main extension along the x- and y-axes and a comparably short extension along the z-axis. In this context, the term "horizontal" may thus mean "oriented in parallel with a direction of main extension", while the term "vertical" may mean "oriented perpendicular to the directions of main extension". Hence, even if the magnetic element/the component carrier is turned around, the terms "vertical" and "horizontal" always have the same meaning. Further, the magnetic element may comprise different shapes, for example one of circular, rectangular, polygonal.

According to an exemplary embodiment, the disclosure may be based on the idea that an efficient and robust magnetically enhanced inductance (value) for a component carrier can be provided, when an embedded electrically conductive layer is structured so that a part of the layer forms an inductive element, and when said inductive element is (at least partially) embedded in magnetic matrix material.

The inventors have found that it may be surprisingly efficient to provide an embedded magnetically enhanced inductance in this manner. In particular, a higher inductance value may be provided, since a large amount of magnetic material (and accordingly more and larger magnetic particles) may be embedded in component carrier material. Further, a horizontal electric current flow direction (with respect to the component carrier) may be established (since the inductive element is part of a layer and thus extends along the direction of main extension of the component carrier), and thus, significantly lower ohmic resistance values and a thinner component carrier structure may be provided, while manufacturing costs may be saved. Furthermore, this efficiency gain may not suffer from conventional x/y- and z-direction design rule disadvantages.

According to an embodiment, the inductive element is sandwiched between a first part of the magnetic matrix and a third part of the magnetic matrix. In particular, the inductive element is (essentially) enclosed/encapsulated by the magnetic matrix. More in particular, a second part of the magnetic matrix (at least partially) fills space(s) (between windings) of the inductive element.

This may provide the advantage that the inductive element is protected, while a high inductance value (height amount of magnetic material) may be obtained.

According to a further embodiment, the inductive element comprises one or more loops, in particular windings, more in particular a coil-like structure. In particular, the directions of main extension (x, y) of the loops/windings are (essentially) parallel to the directions of main direction (x, y) of the component carrier. This may provide the advantage that an inductance may be easily provided merely by the form of an electrically conductive structure.

In the context of the present document, the term "winding" may particularly denote a loop structure (which may be similar to a helical structure with corners), wherein multiple of such loops may form a coil-type arrangement. However, due to the component carrier manufacturing technology (for instance involving lamination) of the magnetic element and/or due to the used component carrier raw materials (for instance involving planar constituents such as plates and foils), the windings of the coil (like) structure may have edge-like or corner-like portions rather than being limited to a composition of multiple interconnected purely circular structures.

According to a further embodiment, the first part of the magnetic matrix is embedded in a cavity of the stack. Thereby, the first part may be arranged in a stable manner, before forming the inductive element by structuring. In an example, the first part can be located directly below the structured electrically conductive layer.

A second part of the magnetic matrix may be formed directly on the first part, either by adding magnetic material to the first part or by removing material from the first part.

According to a further embodiment, the third part of the magnetic matrix is embedded in a further electrically insulating layer structure of the stack. Said further electrically insulating layer structure can be formed by direct lamination or by adding a lid structure. Thus, the magnetic matrix may be efficiently embedded in a robust manner in the layer stack using standard component carrier manufacturing methods.

According to a further embodiment, a further electrically conductive layer structure is arranged directly on top of the magnetic matrix. According to a further embodiment, the further electrically conductive layer structure is arranged on top of the magnetic matrix with at least one further electrically insulating layer structure in between. This may provide the advantage that a high design-flexibility with respect to the embedding is enabled.

According to a further embodiment, the component carrier further comprises at least one via that extends through the first magnetic matrix and/or the third magnetic matrix in order to electrically connect the (embedded) inductive element. In particular, the via also extends through at least one electrically insulating layer structure (e.g., the further electrically insulating layer structure).

According to a further embodiment, the via is electrically connected to the further electrically conductive layer structure.

According to a further embodiment, the component carrier further comprises at least one further via that extends through the electrically insulating layer structure in order to electrically connect to a part of the structured electrically conductive layer, which part is not the inductive element.

These described measures may enable an efficient and reliable electrical connection to the embedded inductive element and/or the rest (other parts) of the structured electrically conductive layer.

According to a further embodiment, the structured electrically conductive layer is a discontinuous layer. It has been found by the inventors, that an inductive element may be provided in a surprisingly efficient manner, when structuring an existing conductive layer.

In this document, the term "discontinuous" may in particular refer to a non-uniform layer (includes film or sheet) that deviates from a purely continuous (planar) shape. A discontinuous layer may constitute one common or connected integral structure or may be composed of multiple separate no longer connected islands (which may have been separated on the basis of an initially continuous layer). A non-uniform layer may also comprise parts with different heights. For example, the thickness of the inductive element part may be higher or lower (in the vertical direction z) than other parts of the structured electrically conductive layer structure.

According to a further embodiment, the magnetic matrix continuously fills a volume around the electrically conductive structure of the inductive element (and in particular between windings of the inductive element) (full embedding). This may provide the advantage that the electrically conductive structure of the inductive element is enclosed in a stable and robust manner. Further, this may provide the advantage that a high amount of magnetic material can be applied, and an accordingly high inductance can be achieved.

According to a further embodiment, the magnetic matrix comprises at least one of the group consisting of a rigid solid, a sheet, and a paste. Depending on the desired functionality, different configurations of the magnetic matrix may be especially suitable. For example, the magnetic matrix may be configured as a magnetic sheet (rigid) that can be laminated. In this example, the magnetic matrix may comprise a prepreg or another resin with embedded magnetic particles. In another example, the magnetic matrix may be configured as a magnetic paste (viscous) that could be filled/poured in a mold to manufacture the magnetic element.

According to a further embodiment, the magnetic matrix comprises one of the group which consists of: electrically conductive, electrically insulating, partially electrically conductive and partially electrically insulating (e.g., a first electrically conductive part and a second electrically insulating part). Depending on the desired functionality, different configurations of the magnetic matrix may be especially suitable.

According to a further embodiment, the relative magnetic permeability $\mu_r$ of the magnetic matrix is in a range from 2 to $10^6$, in particular 2 to 1000, more in particular 2 to 100, in particular 20 to 80, more in particular around 50. These values are comparably high and can lead to an advantageously high inductance value. Permeability is the measure of magnetization that a material obtains in response to an applied magnetic field. The relative permeability, denoted by the symbol $\mu_r$, is the ratio of the permeability of a specific medium p to the permeability of free space $\mu_0$ (vacuum).

According to a further embodiment, the magnetic matrix comprises at least one material of the group consisting of a ferromagnetic material (e.g., iron, nickel), a ferrimagnetic material, a permanent magnetic material, a soft magnetic material, a ferrite, a metal oxide (e.g., magnetite), a dielectric matrix (e.g., a resin), in particular a prepreg, with magnetic particles therein, and an alloy, in particular an iron alloy or alloyed silicon. Thereby, established materials can be directly applied to manufacture the magnetic matrix in a cost-efficient manner.

A permanent magnetic material may be ferromagnetic material or ferrimagnetic material, and may for instance be provided on the basis of transition metals (with partially filled 3d shell) such as iron or nickel, or on the basis of rare earths (with partially filled 4f shell).

A soft magnetic material may be a material which can be easily re-magnetized, i.e., having a small area of its hysteresis curve. In other words, soft magnetic materials are those materials that are easily magnetized and demagnetized. They may have intrinsic coercivity less than 1000 $Am^{-1}$.

A ferrite may be denoted as a type of ceramic compound composed of $Fe_2O_3$ combined chemically with one or more additional metallic elements. Ferrites are both electrically non-conductive and ferrimagnetic, so they can be magnetized or attracted by a magnet. Ferrites may be implemented as hard ferrites or soft ferrites, depending on the application.

According to a further embodiment, the magnetic matrix comprises a plate-(planar) shape. According to a further embodiment, a direction of main extension (x, y) of the magnetic matrix is oriented essentially parallel to a direction of main extension (x, y) of the stack/component carrier/magnetic inlay.

According to a further embodiment, the inductive element comprises an inductance per area in the range 10 to 10000 $nH/mm^2$. Depending on the geometrical properties (shape, thickness) of the inductive element and the material of the inductive element (and the magnetic matrix), a specific desired inductance value may be adjusted (tuned inductance).

According to a further embodiment, an electric current flow direction through the inductive element is (essentially) in a horizontal direction (i.e., oriented along the x- and/or y-axis) with respect to the stack/component carrier (in other words, the electric current flow direction may be oriented (essentially) parallel to a direction of main extension of the stack/component carrier). The horizontal electric current flow direction may lead to significantly lower ohmic resistance values and a thinner component carrier structure, so that a higher inductance may be obtained, while manufacturing costs may be saved.

According to a further embodiment, the component carrier further comprises an electronic component (in particular an active component) (examples listed further below) assembled to the stack (surface-mounted or embedded). In particular, the magnetic matrix is arranged below, more in particular directly below, the electronic component. According to a further embodiment, the electronic component is electrically/thermally connected to the inductive element.

Such a solution may improve power delivery and may allow for a reduced signal length between the inductor component and the electronic component (silicon).

According to a further embodiment, the size (extension) of the first magnetic matrix and/or the third magnetic matrix is larger (in particular in at least one direction of main extension (x, y) of the component carrier/layer stack) than the size (extension in x, y) of the second magnetic matrix in said direction.

According to a further embodiment, a shift between the first magnetic matrix, the second magnetic matrix, and the third magnetic matrix in at least one direction of main extension (x, y) of the component carrier is 100 µm or less, in particular 50 µm or less. According to a further embodiment, said shift is 10% or lower than the total length of the magnetic matrix.

In case of the described shift, a necking could be received which may lead to an unwanted temperature hotspot that may harmfully impact the functionality or even destroy the component carrier under operation. Surprisingly, it has been found that a reliable functionality may be guaranteed using at least one of the measures described above.

According to a further embodiment, the method further comprises (at least one of the following steps):
i) forming a cavity (e.g., photo-imaging or laser-cutting) in at least one electrically insulating layer structure of the stack,
ii) arranging a first part of the magnetic matrix (at least partially, in particular fully) (e.g., by printing or by arranging a film or an inlay) in the cavity,
iii) forming the electrically conductive layer on or at least partially around the first part of the magnetic matrix.

Using these steps, the magnetic matrix-surrounded inductive element may be formed directly within the component carrier (multi-layer) build-up process.

According to a further embodiment, structuring further comprises (at least one of the following steps):
i) removing electrically conductive material from the electrically conductive layer in order to provide (windings and in between) gaps,
ii) at least partially filling the gaps with a second part of the magnetic matrix.

Thus, structuring an existing conductive (copper) layer may directly result in an inductive element structure that can be efficiently embedded in matrix material (during the build-up process).

According to a further embodiment, structuring further comprises (at least one of the following steps):
i) removing magnetic matrix material (thereby leaving a second part of the magnetic matrix) in order to provide gaps,
ii) at least partially filling (in particular fully filling) the gaps with additional electrically conductive material (thereby providing an embedded winding structure).

This may provide the advantage that the inductive element (being (essentially) on the same vertical level and thus forming part of the structured electrically conductive layer) can be formed directly in the magnetic matrix material.

According to a further embodiment, the method further comprises covering the embedded inductive element with a third part of the magnetic matrix (in particular thereby fully enclosing/encapsulating the inductive element). In this manner, the inductive element may be efficiently protected, while an especially high inductance value may be achievable.

According to a further embodiment, the method further comprises covering the embedded inductive element with a lid structure. In particular, the lid structure comprises a lid electrically insulating layer structure and/or a lid electrically conductive layer structure (e.g., a pre-cut resin, in particular prepreg). This measure may enable an efficient and robust embedding process for the magnetic element.

According to a further embodiment, the component carrier comprises two or more structured electrically conductive layers assembled to the stack, and accordingly two or more inductive elements (at least partially surrounded by magnetic material. In a specific embodiment, the two or more embedded inductive elements may be electrically connected with each other, in particular thereby forming a further winding (further inductance).

In an embodiment, the magnetic element may be configured for shielding electromagnetic radiation from propagating within the component carrier or within the stack (for instance from a first portion of the stack to a second portion of the stack). The magnetic element may however also be configured for shielding electromagnetic radiation from propagating between component carrier and an environment. Such a shielding may include a prevention of electromagnetic radiation from propagating from an exterior of the component carrier to an interior of the component carrier, from an interior of the component carrier to an exterior of the component carrier, and/or between different portions of the component carrier. In particular, such a shielding may be accomplished in a lateral direction of the stack (i.e., horizontally) and/or in a stacking direction of the stack (i.e., vertically). In such an embodiment, the magnetic element may function for shielding electromagnetic radiation to thereby suppress undesired effects of electromagnetic interference (EMI), in particular in the radiofrequency (RF) regime.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a bare die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one (electronic) component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Electroless Palladium Immersion Gold (ENEPIG), gold (in particular hard gold), chemical tin, nickel-gold, nickel-palladium, etc.

The aspects defined above and further aspects of the disclosure are apparent from the examples of embodiment to be described hereinafter and are explained with reference to these examples of embodiment.

BRIEF DESCRIPTION OF THE DRAWINGS

FIG. 1A, FIG. 1B, FIG. 1C, FIG. 1D, FIG. 1E, FIG. 1F, FIG. 1G and FIG. 1H show a method of manufacturing a component carrier according to an exemplary embodiment of the disclosure.

FIG. 2A, FIG. 2B, FIG. 2C, FIG. 2D, FIG. 2E, and FIG. 2F show a method of manufacturing a component carrier according to a further exemplary embodiment of the disclosure.

DETAILED DESCRIPTION OF ILLUSTRATED EMBODIMENTS

Figure 3A:
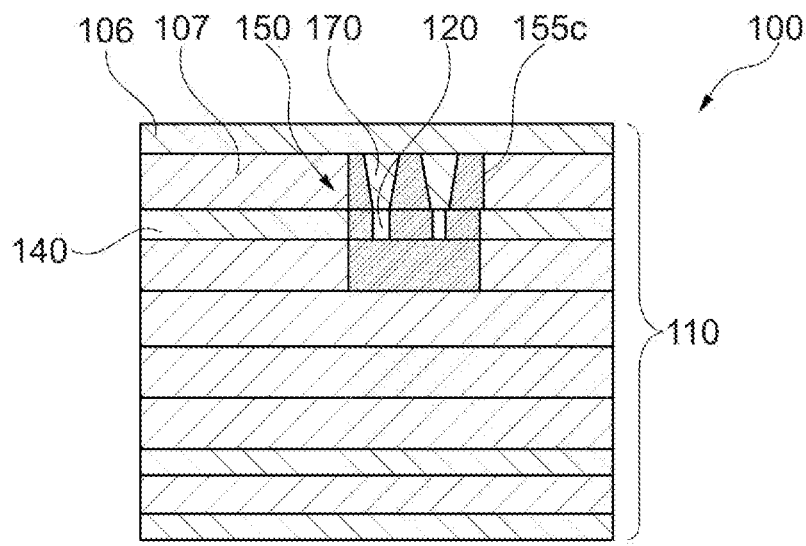
FIG. 3A and FIG. 3B show respectively a component carrier according to a further exemplary embodiment of the disclosure.

The illustrations in the drawings are schematically presented. In different drawings, similar or identical elements are provided with the same reference signs.

FIG. 1A to FIG. 1H show a method of manufacturing a component carrier according to an exemplary embodiment of the disclosure.

As illustrated in FIG. 1A, a component carrier layer stack 110 (e.g., a copper-clad laminate or a plurality of single sheets) is provided which comprises a plurality of electrically insulating layer structures (or only one insulating layer structure) 102 sandwiched between two electrically conductive layer structures 104. Before attaching (laminating) the upper electrically conductive layer structure 104, a cavity 130 has been formed in the top electrically insulating layer structure 103 (e.g., by laser cutting, milling, etc.). The cavity 130 can also be formed by controlled depth milling or femto-laser or pico-laser (in particular when using only one insulating layer structure 102).

As shown in FIG. 1B, a first part of a magnetic matrix 155a (e.g., magnetic paste or a pre-cut magnetic inlay) is formed within the cavity 130, thereby embedding magnetic matrix material 155 in the layer stack 110. Embedding the first part of a magnetic matrix 155a is also done before attaching (laminating) the upper electrically conductive layer structure 104. Forming the magnetic matrix 155a can for example comprise one of the following: printing, arranging a film (local structuring may be needed), arranging an inlay (glue between previous magnetic matrix material can be assumed).

FIG. 1C illustrates in an alternative embodiment (with respect to FIG. 1A), a lid structure 160 is provided and placed on top of the layer stack 110. The lid structure 160 comprises in this example the upper electrically conductive layer structures 104 and an electrically insulating layer structure 103 with the cavity 130 (e.g., a pre-cut prepreg (no flow)).

FIG. 1D shows in an alternative embodiment (with respect to FIG. 1B), the first part of the magnetic matrix 155a is arranged in the cavity 130. This may be done within the lid structure 160 before placing the lid structure 160 on the layer stack 110. In another example, the first part of the magnetic matrix 155a is arranged on the layer stack 110 and is then covered by the lid structure 160.

FIG. 1E shows that following the steps illustrated in FIG. 1A and FIG. 1B or FIG. 1C and FIG. 1D, a semi-finished component carrier (preform) 180 is obtained, which comprises the first part of the magnetic matrix 155a embedded in the cavity 130 within the stack 110.

In FIG. 1F it is further shown that the upper electrically conductive layer structure 104 is structured (patterned) and becomes the structured electrically conductive layer structure 140. Material has been removed during structuring, so that the structured electrically conductive layer structure 140 has been separated into (isolated) parts and forms a discontinuous layer. The part of the structured electrically conductive layer structure 140, which covers the first part of the magnetic matrix 155a, is thereby structured so that it forms one or more inductive elements 120. For example, said part 120 of the structured electrically conductive layer 140 has been shaped in form of windings that function similar to a coil inductance. In between the windings, there are now gaps present. The inductive element(s) may differ in its dimensions (x, z) in a cross-sectional view (e.g., thicker/larger parts may be present).

Optionally, the lower electrically conductive layer structure 104 can also be structured.

As further shown in FIG. 1G, the gaps are at least partially filled by a second part of the magnetic matrix 155b.

Illustrated in FIG. 1H is a component carrier 100 comprising: i) the stack 110 with a plurality of electrically insulating layer structures 102, ii) the structured electrically conductive layer 140 embedded in the stack 110, wherein a part of the electrically conductive layer structure 140 is configured as the inductive element 120, and iii) the magnetic matrix 155 embedded in the stack 110, wherein the magnetic matrix 155 (at least partially) surrounds the inductive element 120 (thereby forming a magnetic element 150).

In this example, the inductive element 120 is fully surrounded (encapsulated) by the magnetic matrix 155, because the structure shown in FIG. 1G (wherein the inductive element 120 is exposed) has been covered by a third part of the magnetic matrix 155c. Said third part of the magnetic matrix 155c is further embedded in a further electrically insulating layer structure 107 that is covered by a further electrically conductive layer structure 106. These further structures 106, 107 can be formed by lamination. In another example, these further structures 106, 107 are formed using a lid structure 160 as described above.

In the example shown, the component carrier 100 is a multi-layer component carrier that comprises a plurality of layers formed in a build-up process. Advantageously, forming and embedding the inductive element can be directly integrated into the layer build-up process.

FIG. 2A to FIG. 2F show a method of manufacturing a component carrier according to a further exemplary embodiment of the disclosure.

As illustrated in FIG. 2A, a component carrier layer stack 110 is provided which comprises a plurality of electrically insulating layer structures 102 sandwiched between two electrically conductive layer structures 104. A cavity 130 has been formed in the top electrically insulating layer structure 103 and in the upper electrically conductive layer structure 104, which is a structured electrically conductive layer structure 140. The cavity 130 in this example is a large cavity, e.g., formed by photo-imaging or laser. The cavity 130 can also be formed by controlled depth milling or femto-laser or pico-laser (in particular when using only one insulating layer structure 102).

In FIG. 2B, magnetic matrix material 155 is arranged (e.g., printed) within the cavity 130 and fully fills the cavity 130.

In FIG. 2C, gaps are formed (e.g., using a laser) in an upper part of the magnetic matrix material 155, which upper part corresponds to a second part of the magnetic matrix 155b. A lower part, wherein no gaps are formed, corresponds to a third part of the magnetic matrix 155c. The second part of the magnetic matrix 155b is (essentially) on the same vertical level as the structured electrically conductive layer structure 140. The gaps are formed in a manner that a (negative) shape of a winding is provided in the second part of the magnetic matrix 155b.

In FIG. 2D, the gaps are filled with electrically conductive material (e.g., copper paste or during a local plating step), so that the electrically conductive layer structure 140 is further structured by the addition of material. Since the gaps and the electrically conductive layer structure 140 are on the same height (vertical level), the additional electrically conductive material also forms part of the (discontinuous) structured electrically conductive layer structure 140. The electrically conductive material filling the gaps is arranged in form of windings, so that the inductive element 120 (in the structured electrically conductive layer structure 140) is formed. An upper surface of said inductive element 120 is still exposed.

In FIG. 2E, a lid structure 160, which comprises a lid electrically insulating layer structure 162 with a cavity, and a lid electrically conductive layer structure 164, is provided and placed on top of the layer stack 110. In another example, a further electrically insulating layer structure 107 and/or a further electrically conductive layer structure 106 can be formed, e.g., by lamination.

As indicated in FIG. 2F, before the lid structure 160 is placed and arranged to the layer stack 110, a third part of the magnetic matrix 155c has been arranged on the exposed surface of the inductive element 120 (in another embodiment, the third magnetic matrix material 155c is attached to the lid structure 160). Thereby, the inductive element 120 is fully encapsulated in magnetic matrix material 155. The obtained component carrier 100 is very similar to the one described for FIG. 1H with the difference being, that the lid electrically conductive layer structure 164 is arranged directly on top of the magnetic matrix 155 instead of a further electrically insulating layer structure 107.

Figure 3B:
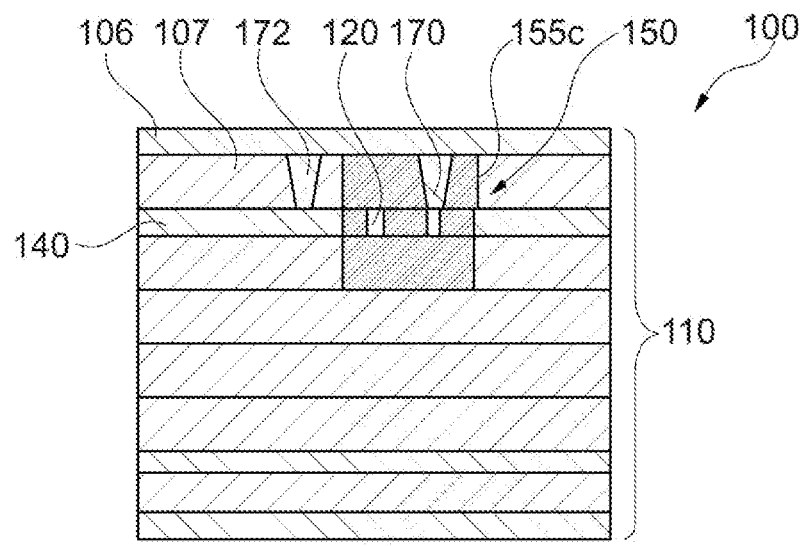

FIG. 3A and FIG. 3B show respectively a component carrier 100 according to an exemplary embodiment of the disclosure.

As illustrated in FIG. 3A, two blind holes have been drilled by laser drilling through the third magnetic matrix 155c and have been filled by copper material to yield (blind) vias 170 that are electrically connect to the embedded inductive element 120. The vias 170 are further electrically/thermally connected to the further electrically conductive layer structure 106.

In FIG. 3B, in a very similar manner to the component carrier in FIG. 3A, one of the vias 170 is a further via 172, that has been formed through the further electrically insulating layer structure 107 in order to electrically connect to a part of the structured electrically conductive layer 140, which part is not the inductive element 120. The further via 172 is also electrically/thermally connected to the further electrically conductive layer structure 106.

Figure 4:
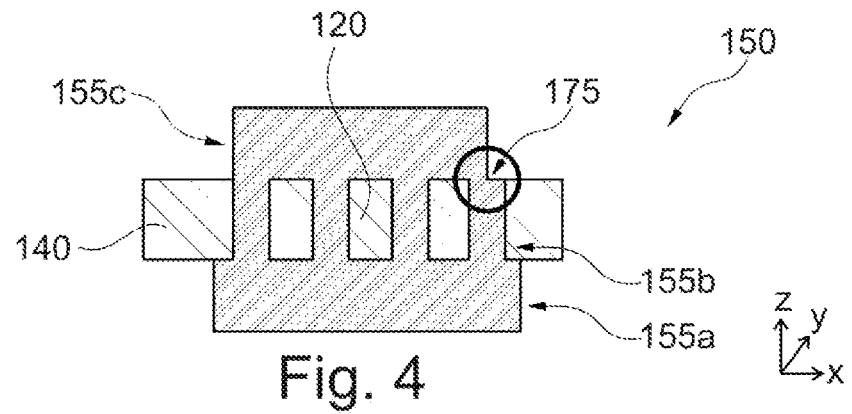
FIG. 4 shows a magnetic element according to a further exemplary embodiment of the disclosure.

FIG. 4 shows a magnetic element 150 in/for a component carrier 100 according to a further exemplary embodiment of the disclosure. The extension of the first magnetic matrix 155a in the direction of main extension (x) of the stack 110 is larger than the extension of the second magnetic matrix 155b and the third magnetic matrix 155c in said direction (x). A shift 175 (form of a neck) between the second magnetic matrix 155b and the third magnetic matrix 155c in the direction of main extension (x) of the stack 110 is 10% or lower than the total length of the magnetic matrix 155.

It should be noted that the term "comprising" does not exclude other elements or steps and the "a" or "an" does not exclude a plurality. Also, elements described in association with different embodiments may be combined.

Implementation of the disclosure is not limited to the preferred embodiments shown in the figures and described above. Instead, a multiplicity of variants is possible which variants use the solutions shown and the principle according to the disclosure even in the case of fundamentally different embodiments.

REFERENCE SIGNS 100 component carrier
102 electrically insulating layer structure
103 structured electrically insulating layer structure
104 electrically conductive layer structure
106 further electrically conductive layer structure
107 further electrically insulating layer structure
110 layer stack
120 inductive element
130 cavity
140 structured electrically conductive layer
150 magnetic element
155 magnetic matrix (material)
155a first part of magnetic matrix
155b second part of magnetic matrix
155c third part of magnetic matrix
160 lid structure
162 lid electrically insulating layer structure
164 lid electrically conductive layer structure
170 via
172 further via
175 shift
180 semi-finished component carrier

The invention claimed is:

1. A component carrier, comprising:
a stack comprising at least one electrically insulating layer structure;
a structured electrically conductive layer assembled to the stack,
wherein the structured electrically conductive layer comprises a first portion being patterned so that a discontinuous layer is formed as a patterned portion divided from a second portion of the structured electrically conductive layer, when observed along a cross section of the patterned portion,
wherein a part of the structured electrically conductive layer is configured as an inductive element; and
a magnetic matrix embedded in the stack,
wherein the magnetic matrix at least partially surrounds the inductive element,
wherein the second portion of the structured electrically conductive layer surrounds the magnetic matrix when observed along a cross section of the inductive element, and
wherein the magnetic matrix comprises:
(i) a first part on which the structured electrically conductive layer structure is formed and functions as the inductive element,
(ii) a second part at least partially filling a gap between the structured electrically conductive layer structure forming the inductive element, and
(iii) a third part covering the structured electrically conductive layer structure forming the inductive element; and
an extension of the first part of the magnetic matrix and the third part of the magnetic matrix in at least one of the directions of main extension of the stack is larger than an extension of the second part of the magnetic matrix in said direction.

2. The component carrier according to claim 1,
wherein the inductive element is sandwiched between the first part of the magnetic matrix and the third part of the magnetic matrix,
wherein the inductive element is essentially encapsulated by the magnetic matrix,
wherein the second part of the magnetic matrix at least partially fills a space in the inductive element.

3. The component carrier according to claim 2,
wherein the first part of the magnetic matrix is embedded in a cavity of the stack.

4. The component carrier according to claim 2,
wherein the third part of the magnetic matrix is embedded in a further electrically insulating layer structure of the stack.

5. The component carrier according to claim 2, further comprising:
at least one via that extends through the first magnetic matrix and/or the third magnetic matrix in order to electrically connect the inductive element.

6. The component carrier according to claim 1,
wherein the inductive element comprises one or more windings arranged in a coil-like structure.

7. The component carrier according to claim 1,
wherein a further electrically conductive layer structure is arranged directly on top of the magnetic matrix; or
wherein a further electrically conductive layer structure is arranged on top of the magnetic matrix with at least one further electrically insulating layer structure in between.

8. The component carrier according to claim 7,
wherein a via is electrically connected to the further electrically conductive layer structure.

9. The component carrier according to claim 8, further comprising:
at least one further via that extends through the further electrically insulating layer structure in order to electrically connect to a part of the structured electrically conductive layer which part is not the inductive element.

10. The component carrier according to claim 1,
wherein the structured electrically conductive layer is a discontinuous layer.

11. The component carrier according to claim 1, wherein the magnetic matrix comprises at least one of the following features:
wherein the magnetic matrix continuously fills a volume around the inductive element between windings of the inductive element;
wherein the magnetic matrix comprises at least one of the group consisting of a rigid solid, a sheet, and a paste;
wherein the magnetic matrix comprises one of the group which consists of: electrically conductive, electrically insulating, partially electrically conductive and partially electrically insulating;
wherein the relative magnetic permeability $\mu_r$ of the magnetic matrix is in a range from 2 to $10^6$;
wherein the magnetic matrix comprises at least one material of the group consisting of a ferromagnetic material, a ferrimagnetic material, a permanent magnetic material, a soft magnetic material, a ferrite, a metal oxide, a dielectric matrix, a prepreg with magnetic particles therein, and an alloy;
wherein the magnetic matrix comprises a planar shape;
wherein a direction of main extension of the magnetic matrix is oriented essentially parallel to a direction of main extension of the stack.

12. The component carrier according to claim 1, wherein the inductive element comprises an inductance per area in the range of 10 to 10000 nH/mm².

13. The component carrier according to claim 1, further comprising:
an electronic component assembled to the stack,
wherein the magnetic matrix is arranged below the electronic component.

14. The component carrier according to claim 1, further comprising at least one of the following features:
the extension of the first part of the magnetic matrix or the third part of the magnetic matrix in at least one of the directions of main extension of the stack is larger than the extension of the second part of the magnetic matrix in said direction;
a shift between at least two of the first part of the magnetic matrix, the second part of the magnetic matrix, and the third part of the magnetic matrix, in at least one of the directions of main extension of the stack, is 100 μm or less.

15. A method of manufacturing a component carrier, the method comprising:
providing a stack comprising at least one electrically insulating layer structure;
assembling an electrically conductive layer to the stack;
structuring the electrically conductive layer, so that a part of the structured electrically conductive layer is configured as an inductive element;
wherein the structured electrically conductive layer comprises a first portion being patterned so that a discontinuous layer is formed as a patterned portion divided from a second portion of the structured electrically conductive layer, when observed along a cross section of the patterned portion, and
assembling a magnetic matrix to the stack, so that the magnetic matrix at least partially surrounds the inductive element,
wherein the second portion of the structured electrically conductive layer surrounds the magnetic matrix, when observed along the cross section of the inductive element, and
wherein the magnetic matrix comprises:
(i) a first part on which the structured electrically conductive layer structure is formed and functions as the inductive element,
(ii) a second part at least partially filling a gap between the structured electrically conductive layer structure forming the inductive element, and
(iii) a third part covering the structured electrically conductive layer structure forming the inductive element; and
an extension of the first part of the magnetic matrix and the third part of the magnetic matrix in at least one of the directions of main extension of the stack is larger than an extension of the second part of the magnetic matrix in said direction.

16. The method according to claim 15, wherein the method further comprises:
forming a cavity in at least one electrically insulating layer structure of the stack;
arranging a first part of the magnetic matrix at least partially in the cavity; and
assembling the electrically conductive layer on or at least partially around the first part of the magnetic matrix.

17. The method according to claim 15, wherein structuring further comprises:
removing electrically conductive material from the electrically conductive layer in order to provide gaps; and
at least partially filling the gaps with the second part of the magnetic matrix.

18. The method according to claim 17, further comprising:
covering the embedded inductive element with the third part of the magnetic matrix.

19. The method according to claim 15, wherein structuring further comprises:
removing magnetic matrix material in order to provide gaps; and
at least partially filling the gaps with additional electrically conductive material.

20. The method according to claim 15, further comprising:
covering the embedded inductive element with a lid structure, wherein the lid structure is electrically insulating, electrically conductive, or both.

21. A component carrier, comprising:
a stack comprising at least one electrically insulating layer structure;
a structured electrically conductive layer assembled to the stack,
wherein the structured electrically conductive layer comprises a first portion being patterned so that a discontinuous layer is formed as a patterned portion divided from a second portion of the structured electrically conductive layer, when observed along a cross section of the patterned portion,
wherein a part of the structured electrically conductive layer is configured as an inductive element; and
a magnetic matrix embedded in the stack,
wherein the magnetic matrix at least partially surrounds the inductive element,
wherein the second portion of the structured electrically conductive layer surrounds the magnetic matrix when observed along a cross section of the inductive element, and
wherein the magnetic matrix comprises:
(i) a first part on which the structured electrically conductive layer structure is formed and functions as the inductive element,
(ii) a second part at least partially filling a gap between the structured electrically conductive layer structure forming the inductive element, and
(iii) a third part covering the structured electrically conductive layer structure forming the inductive element; and
an extension of the first part of the magnetic matrix and/or the third part of the magnetic matrix in at least one of the directions of main extension of the stack is larger than an extension of the second part of the magnetic matrix in said direction.

* * * * *